United States Patent
Steele

(10) Patent No.: US 7,433,197 B2
(45) Date of Patent: Oct. 7, 2008

(54) ELECTRONIC MODULE AND METHOD FOR SEALING AN ELECTRONIC MODULE

(75) Inventor: Ryan N. Steele, Dearborn, MI (US)

(73) Assignee: TK Holdings Inc, Auburn Hills, MI (US)

( * ) Notice: Subject to any disclaimer, the term of this patent is extended or adjusted under 35 U.S.C. 154(b) by 0 days.

(21) Appl. No.: 11/467,708

(22) Filed: Aug. 28, 2006

(65) Prior Publication Data

US 2007/0049121 A1  Mar. 1, 2007

Related U.S. Application Data

(60) Provisional application No. 60/711,433, filed on Aug. 26, 2005.

(51) Int. Cl.
*H05K 5/00* (2006.01)

(52) U.S. Cl. ............ 361/752; 361/767; 361/760

(58) Field of Classification Search ............ 361/752, 361/790, 797, 800, 748, 767, 760; 312/223; 174/138 R, 138 G; 439/625–626

See application file for complete search history.

(56) References Cited

U.S. PATENT DOCUMENTS

| 5,699,231 | A | | 12/1997 | ElHatem et al. |
| 5,880,937 | A | * | 3/1999 | Schadhauser et al. ........ 361/794 |
| 5,906,512 | A | * | 5/1999 | Reynolds .................... 439/579 |
| 6,272,015 | B1 | | 8/2001 | Mangtani |
| 6,778,400 | B2 | * | 8/2004 | Kurle et al. ................. 361/752 |
| 7,146,721 | B2 | * | 12/2006 | Hunkeler et al. .............. 29/841 |
| 2003/0039107 | A1 | * | 2/2003 | Modi ......................... 361/752 |
| 2007/0157699 | A1 | * | 7/2007 | Manlove et al. ............ 73/12.01 |

FOREIGN PATENT DOCUMENTS

DE  103 28 005 B3  1/2005
EP   0 718 160 B1   6/1996

* cited by examiner

*Primary Examiner*—Hung S Bui
(74) *Attorney, Agent, or Firm*—Foley & Lardner LLP

(57) ABSTRACT

A method and apparatus for sealing electronic module conductors is provided. Electronic modules typically consist of an electronic circuit board ("PCB") with electronic components, an integral housing/connector assembly, conductors such as wires or terminal pins, and a mounting feature. A method for sealing electronic module conductors is provided which improves the sealing properties around the conductors positioned on the first and second side of the PCB.

9 Claims, 3 Drawing Sheets

ELECTRONIC MODULE AND METHOD FOR SEALING AN ELECTRONIC MODULE

CROSS REFERENCE TO RELATED APPLICATIONS

This application claims priority to and the benefit of U.S. Provisional Patent Application No. 60/711,433, filed on Aug. 26, 2005 (incorporated by reference herein in its entirety).

BACKGROUND

The present invention generally relates to the field of electronic vehicle systems. More specifically, the present invention relates to an electronic module and to a method for sealing the components of an electronic module.

Electronic vehicle systems may comprise numerous electronic modules. For example, crash sensors are used in a vehicle safety system to collect information related to a vehicle collision. Generally, the sensors consist of several electronic components. The electronic components are typically mounted on a printed circuit board (PCB). Due to possible exposure to uncontrolled environmental conditions the PCB and its components need to be protected.

To protect the above-described electronic components, the PCB/electronic component assembly is usually encased in a housing assembly which can be composed of a plurality of different materials. The housing provides protection from water, moisture, or other environmental hazards. Current carrying conductors such as metal (conductive) terminals and/or wires may also be encased in the housing. The conductive terminals allow the PCB/electronic component assembly to connect to other devices or applications. For example, a typical sensor assembly consists of terminal pins that intersect the PCB from its bottom-side. This configuration is used to aid assembly in manufacturing.

The terminals and the electronic components are sealed in the housing to further prevent environmental damage to the terminals and electronic components. Specifically, the electronic components mounted on the PCB are immersed in a potting material. During the anticipated product life of the electronic components, certain, but not all of the electronic components may be damaged by thermal stresses caused from being immersed in a potting material. Generally, only one side of the PCB is potted due to the potential stress that can be exerted on the electronic components. Additionally, potting both sides of the PCB adds cost, weight and complexity to the assembly, even in situations where critical components are placed in the top-side potting. Therefore, in most conventional systems, potting is applied to the exposed side of the PCB. In turn, the critical electronic components are located on the opposite or unexposed side of the PCB. Typical potting materials include urethane, silicon, 1-part, 2-part, UV cure, heat cure, or humidity cure. Generally, the potting material is a polymer sealant that has relatively low-viscosity and is used in filling applications.

As stated above, the typical one-sided potting process only seals one side (i.e. the top side) of the PCB. Due to the manufacturing concerns mentioned above, the bottom-side of the PCB is left un-potted. The generic potting process thus fails to create an adequate barrier to the outside environment along the current carrying conductors. The moisture or exposure to the outside could cause electrical malfunction of the PCB or the electronic components which are populated on the PCB. Therefore, an electronic module and a method for sealing the electronic module is needed to protect the current carrying conductors without exposing the electronic components to detrimental manufacturing and environmental conditions.

SUMMARY

According to one embodiment of the invention, an electronic module includes an electronic module housing and a printed circuit board. The printed circuit board has a first and a second side and is positioned in the electronic module housing such that there is a leak path between an edge of the printed circuit board and a surface of the electronic module housing. A potting well is formed in the electronic module housing beneath a portion of the second side of the printed circuit board.

According to another embodiment of the invention, a method for sealing an electronic module includes providing an electronic module housing, having a potting well, placing a printed circuit board into the electronic module housing, such that a leak path is formed between an edge of the printed circuit board and a surface of the electronic module housing, and such that a portion of the second side of the printed circuit board is positioned above the potting well, and dispensing a potting material on the first side of the printed circuit board such that the potting material flows down the leak path and into the potting well.

It is to be understood that both the foregoing general description and the following detailed description are exemplary and explanatory only, and are not restrictive of the invention as claimed. These and other features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings. It should be understood that the following description is intended to describe exemplary embodiments of the invention, and not to limit the invention.

Figure 1:
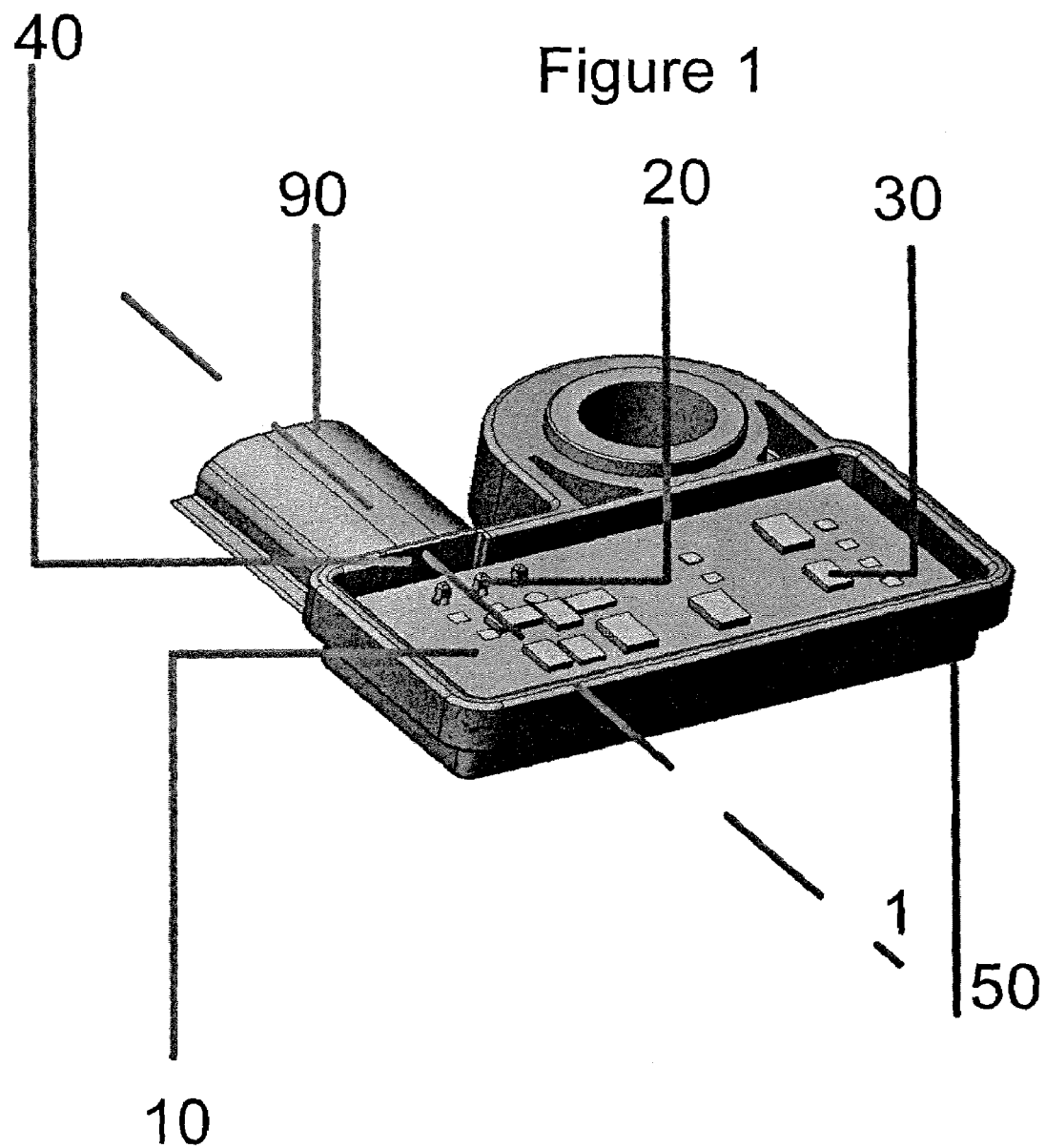
FIG. 1 is a perspective view of an electronic module housing with a printed circuit board placed in the electronic module housing according to one embodiment of the invention.

FIG. 1 is a perspective view of an electronic module housing 50 with a PCB 10 placed in the electronic module housing 50. A connector 90 is attached to the housing 50. The electronic module housing 50 may house a number of electronic devices such as a crash sensor. For example, airbag crash sensors typically consist of a PCB with electronic components, an integral housing 50/connector 90 assembly, and a mounting feature. Electronic modules such as crash sensors are encased in a housing 50 made of a plurality of different materials to protect the electronic modules from water, moisture, or other environmental hazards. The housing 50 and connector 90 assembly usually consists of a polymer that has good physical properties for connector applications. In FIG. 1, the PCB 10 is populated by a plurality of electronic components 30 to form an electronic module. In addition, the PCB 10 also has a plurality of current carrying conductors 20 which are mounted to the electronic module housing 50. The conductors 20 are configured to carry current and facilitate a connection between the electronic module and other devices or applications. Specifically, the conductors 20 may be terminal pins. In the alternative, the conductors 20 may be wires soldered to the PCB 10.

Figure 2:
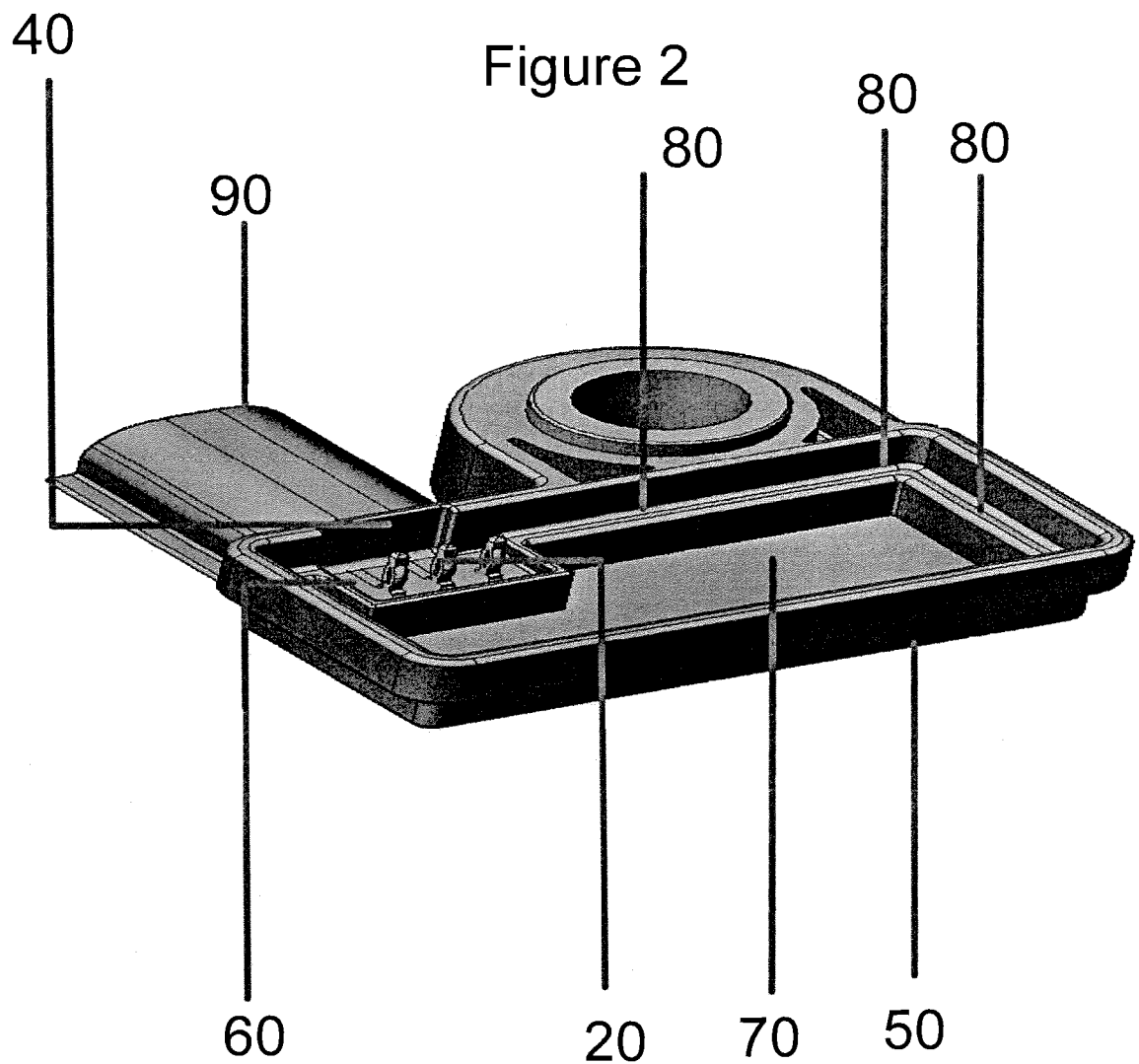
FIG. 2 is a perspective view of an electronic module housing without a printed circuit board placed in the electronic module housing according to one embodiment of the invention.

FIG. 2 is a perspective view of a electronic module housing 50 without a printed circuit board placed in the electronic module housing 50. FIG. 2 shows a potting well 60 for enclosing the conductors 20. During assembly of the electronic module, a PCB 10 is placed into the electronic module housing 50 and rests on the edges of the housing 80. The potting well 60 is positioned below the edges of the housing 80.

Figure 3:
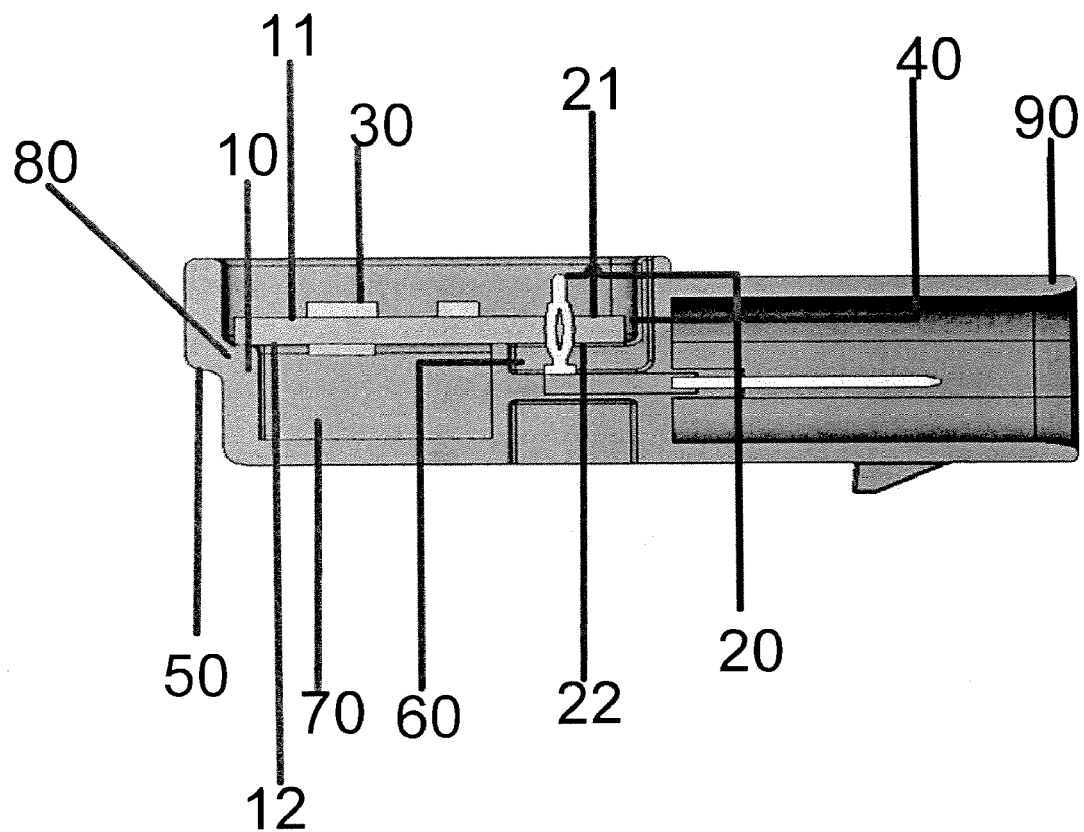
FIG. 3 is a sectional view of an electronic module housing with a printed circuit board placed in the electronic module housing according to one embodiment of the invention.

FIG. 3 is a sectional view of an electronic module housing 50 with a printed circuit board 10 placed in the electronic module housing 50. FIG. 3 represents the section as viewed from line 1 in FIG. 1. The PCB 10 is positioned in the housing 50 such that a leak path 40 is formed between an edge of the PCB 10 and the housing 50. In one embodiment of the present invention, the PCB 10 is placed into the electronic module housing 50 such that the terminal pins 20 slide through the second side of the PCB 12 to the first side of the PCB 11. In the alternative, wires 20 are soldered to both sides of the PCB 10. A potting material is dispensed near the conductors 20 on the first side of the printed circuit board 21. Following the leak path 40, the potting material leaks between an edge of the PCB 10 and a surface of the electronic module housing 50 into the potting well 60. As shown, the internal potting well 60 physically separates the conductors 20 from the electronic components 30 positioned on the underside of the PCB 10.

Figure 4:
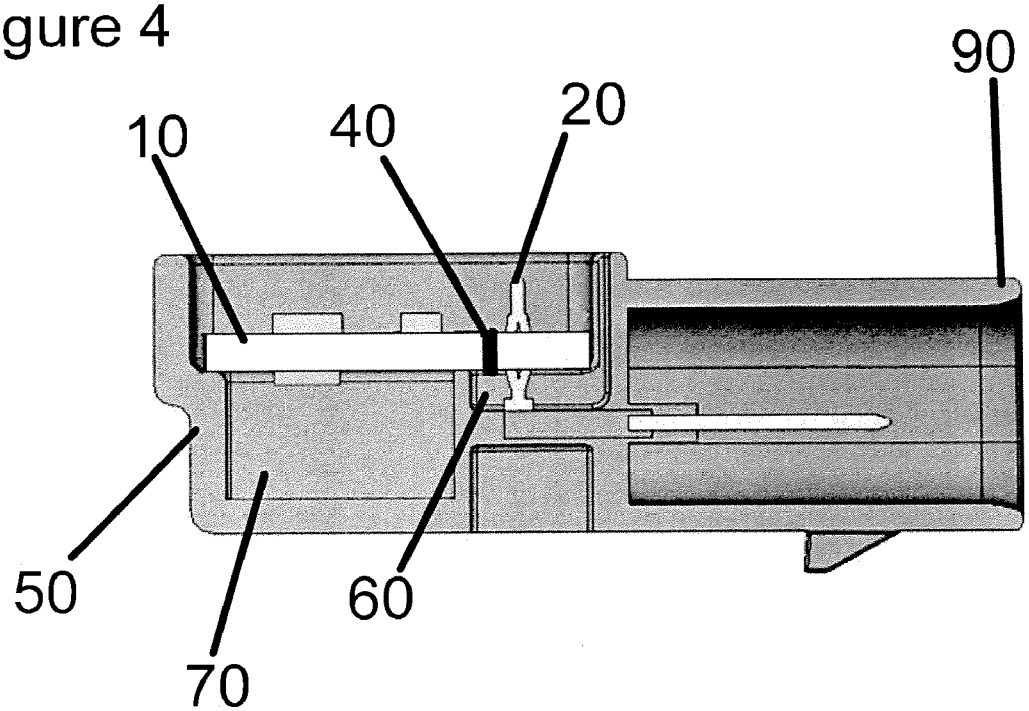
FIG. 4 is a sectional view of an electronic module housing with a printed circuit board placed in the electronic module housing according to one embodiment of the invention.

According to another embodiment of the invention, and as shown in FIG. 4, the PCB 10 is positioned in the housing 50 such that a leak path 40 is formed via a hole in the PCB 10. A potting material is dispensed near the conductors 20 on the first side of the printed circuit board 21. Following the leak path 40, the potting material leaks through the hole in the PCB 10 and into the potting well 60. As shown, the internal potting well 60 physically separates the conductors 20 from the electronic components 30 positioned on the underside of the PCB 10.

In the alternative, according to another embodiment of the invention, the terminal pins 20 are mounted onto the PCB 10 prior to placement into the electronic module housing 50. The terminal pin areas of the first side 21 and the second side 22 of the PCB 10 are potted and then allowed to cure. The PCB 10 is then inserted into the electronic module housing 50. Potting material is then applied to the exposed side of the PCB 10.

Accordingly, one skilled in the art would realize the benefits of the above-described electronic module and method for sealing the electronic module conductors. As shown in FIG. 3, sensitive electronic components 30 that are mounted to the PCB 10 are located in a region that will remain free of any potting material that is dispensed around the conductor regions. Simultaneously, the potting material covers the plurality of conductors 20 on both sides of the PCB. Thus, the above-described apparatus and method provide the conductors 20 with additional protection against environmental conditions without subjecting sensitive electronic components mounted on the PCB to the thermal stress caused during the application of potting material.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention.

What is claimed is:

1. An electronic module, comprising:
   an electronic module housing;
   a printed circuit board, having a first and a second side and a leak path;
   a potting well formed in the electronic module housing beneath the leak path on the underside of the printed circuit board;
   a conductor connected to the housing and the printed circuit board such that the conductor is positioned in the potting well and is exposed on the first side of the printed circuit board, wherein the conductor is insulated by potting material and wherein the module is configured so that excess potting material collects in the potting well via the leak path; and
   one or more electronic components positioned on the underside of the printed circuit board, wherein the potting well separates the conductor from the electronic components so as to prevent the circuit components from being exposed to the potting material.

2. The electronic module of claim 1, wherein the leak path is positioned between an edge of the printed circuit board and a surface of the electronic module housing.

3. The electronic module of claim 1, wherein the leak path is formed as a hole in the printed circuit board.

4. The electronic module of claim 1, wherein the conductors are terminal pins arranged to pass through the printed circuit board.

5. The electronic module of claim 1, wherein the conductors are wires soldered to the printed circuit board.

6. The electronic module of claim 1, wherein the electronic module is a crash sensor for sensing a vehicle impact and deploy an airbag.

7. The electronic module of claim 1, further comprising conductors connected to the housing and the printed circuit board such that the conductors are positioned in the potting well and are exposed on the first side of the printed circuit board.

8. The electronic module of claim 7, further comprising a potting material dispensed on the first side of the printed circuit board, dispensed in the leak path, and dispensed in the potting well.

9. The electronic module of claim 8, wherein a plurality of circuit components are positioned on the first and/or second side of the printed circuit board.

\* \* \* \* \*